United States Patent
Beck et al.

(10) Patent No.: US 7,064,609 B1
(45) Date of Patent: Jun. 20, 2006

(54) HIGH VOLTAGE, LOW-OFFSET OPERATIONAL AMPLIFIER WITH RAIL-TO-RAIL COMMON MODE INPUT RANGE IN A DIGITAL CMOS PROCESS

(75) Inventors: Riley D. Beck, Eagle Mountain, UT (US); Aaron M. Shreeve, Austin, TX (US)

(73) Assignee: AMI Semiconductor, Inc., Pocatello, ID (US)

( * ) Notice: Subject to any disclaimer, the term of this patent is extended or adjusted under 35 U.S.C. 154(b) by 60 days.

(21) Appl. No.: 10/919,757

(22) Filed: Aug. 17, 2004

(51) Int. Cl.
*H03F 3/45* (2006.01)
(52) U.S. Cl. .................................................. 330/253
(58) Field of Classification Search ............... 330/253, 330/295, 257
See application file for complete search history.

(56) References Cited

U.S. PATENT DOCUMENTS

| | | | |
|---|---|---|---|
| 4,638,259 A | 1/1987 | Saari | 330/253 |
| 5,808,513 A * | 9/1998 | Archer | 330/253 |
| 6,218,892 B1 | 4/2001 | Soumyanath et al. | 327/537 |
| 6,590,453 B1 | 7/2003 | Tran et al. | 330/255 |
| 6,657,495 B1 | 12/2003 | Ivanov et al. | 330/255 |

OTHER PUBLICATIONS

A 1-V 5 uW CMOS-Opamp with Bulk-Driven Input Transistors Kimmo Lasanen, Elvi Raisanen-Ruotsalainen, Juba Kostamovaara IEEE 2000.
Designing -V Op Amps Using Standard Digital CMOS Tecnology Benjamin J. Blalock, Phillip E. Allen, Gabriel A. Rincon-Mora IEEE 1998.

* cited by examiner

*Primary Examiner*—Robert Pascal
*Assistant Examiner*—Hieu Nguyen
(74) *Attorney, Agent, or Firm*—Workman Nydegger

(57) ABSTRACT

An operational amplifier with two differential pairs coupled to different current sources. The gate terminals of the transistors in the first differential pair are used as input terminals providing common mode input for most of the rail-to-rail voltage. The bulk terminals of the transistors in the second differential pair are used as input terminals providing common mode input for the remainder of the rail-to-rail voltage to thereby accomplish full rail-to-rail common mode. By using the bulk terminals of the field effect transistors in the second differential pair, rather than the gate terminals, as the input terminal, the operational amplifier may be constructing in a single well, thereby being compatible with standard digital CMOS processes. Alternatively, the bulk-driven transistors may be replaced with gate-driven depletion type transistors. The high voltage transistors in the output stage further reduce the offset voltage of the operational amplifier.

31 Claims, 5 Drawing Sheets

HIGH VOLTAGE, LOW-OFFSET OPERATIONAL AMPLIFIER WITH RAIL-TO-RAIL COMMON MODE INPUT RANGE IN A DIGITAL CMOS PROCESS

BACKGROUND OF THE INVENTION

1. The Field of the Invention

The present invention relates generally to analog circuits. More specifically, the present invention relates to high-voltage, low-offset operational amplifiers with rail-to-rail common mode input range that may be implemented using a digital CMOS process.

2. Background and Relevant Art

Electronic circuitry provides complex functionality that is proving ever more useful. Electronic circuitry pervades our modern lives in areas such as communication, entertainment, travel, productivity, and the like. Complex circuit functionality is enabled by cooperative interaction between a variety of electronic components. Such electronic components may include analog components such as, for example, operational amplifiers, as well as digital circuitry. It is ever more desirable to integrate as many electronic components as possible on a single chip. This reduces the number of discrete components required to accomplish certain functionality thereby providing significant size, cost, and reliability benefits.

However, integrating high voltage components such as high voltage operational amplifiers into a low voltage digital process can be troublesome. To achieve high voltage analog components in a digital process, special devices such as the lateral DMOS or the extended drain MOSFET are constructed. These special devices have higher breakdown voltages to withstand high voltage levels. However, these devices are not very practical for precision analog design because of their poor matching characteristics and device limitations. For example, poor matching characteristics can lead to high offset voltages for operational amplifiers.

FIG. 5 illustrates a conventional operational amplifier 500 that uses two differential pairs to achieve rail-to-rail common mode input range. "Rail-to-Rail" common mode input range means that the common mode input range spans from VSS to VDD, the two supply voltage rails.

Referring to FIG. 5, field effect transistors Q501 and Q502 are part of the PMOS differential input pair that generates a common-mode range from VSS to VDD-VTP, where VTP is the threshold voltage of the PMOS field effect transistor. Hereinafter, field effect transistors may also be referred to simply as "transistors". Transistors Q503 and Q504 are an NMOS differential input pair that supply a common-mode range from VTN to VDD, where VTN is the threshold voltage of the NMOS field effect transistor. Using these two differential input stages together allows for a rail-to-rail common-mode input range.

Other conventional operational amplifiers that achieve a wide common mode input range include the use of bulk driven transistors, or bulk modulated transistors at the input stage. The bulk driven input devices have a gate to source bias such that they are always on. The bulks are tied to the input signal that effectively modulates the threshold voltage of the input devices and also their current.

These conventional operational amplifiers are generally designed for and effective in low voltage amplifiers. These designs could be modified for high voltage designs by replacing the low voltage devices with high voltage MOS devices. However, there are several drawbacks to this. First, extra processing steps would typically be used over and above standard digital CMOS processes to generate a dual well process to ensure that the amplifier is in a safe operating area. Second, high voltage MOS devices can also have a mismatch between devices that is three to five times larger than the low voltage MOSFET, so the amplifiers will have a higher offset. Third, the high voltage devices also have the limitation that the gate-source and gate-bulk voltages are two to twenty times smaller than the potential that can be applied to the drain-bulk, drain-gate and drain-source nodes. Accordingly, extra care should be taken to modify the design to meet these three constraints.

Other amplifier architectures have been used in the design of high voltage applications. One such architecture uses low voltage devices, but requires a special process that can have devices with differing threshold voltages.

Accordingly, what would be advantageous is a high-voltage rail-to-rail common mode input range operational amplifier that may be implemented using standard digital CMOS processes. It would further be desirable if such an operational amplifier would have low offset voltage for precision applications.

BRIEF SUMMARY OF THE INVENTION

The foregoing problems with the prior state of the art are overcome by the principles of the present invention, which relate to an operational amplifier. The operational amplifier has an input stage that includes two differential pairs, a positive and negative input terminal, and a first and second current source. A first differential pair is coupled to the first current source, and the second differential pair is coupled to the second current source.

The gate terminal of a first field effect transistor in the first differential pair is coupled to the positive input terminal. A gate terminal of the second field effect transistor in the first differential pair is coupled to the negative input terminal. In accordance with a first embodiment of the invention, the bulk terminal of the first field effect transistor in the second differential pair is coupled to the negative input terminal. Furthermore, the bulk terminal of the second field effect transistor in the second differential pair is coupled to the positive input terminal. In accordance with a second embodiment of the invention, the second differential pair includes gate driven depletion type transistors. The gate terminal of the first depletion type field effect transistor in the second differential pair is coupled to the negative input terminal. Furthermore, the gate terminal of the second depletion type field effect transistor in the second differential pair is coupled to the positive input terminal.

The first differential pair is used for common mode input range for most of the rail-to-rail voltage, while the second differential pair is used for common mode input range for the remainder of the rail-to-rail voltage. Accordingly, full rail-to-rail common mode input range is accomplished. Furthermore, by using the bulk terminals of the field effect transistors in the second differential pair as the input terminal, rather than using the gate terminals as the input terminal, the operational amplifier may be constructed using a single well process, thereby being compatible with standard digital CMOS processes. The single well process is also possible in the second embodiment when driving the gate terminals of the depletion type transistors, although an additional depletion mode implant would typically be used.

The use of the single well process allows the high voltage amplifier to be constructed on the same chip as digital circuitry thereby reducing the number of discrete devices. This reduces the cost of manufacture for the digital circuitry, reduces its size, and increases its reliability. Additionally, high voltage field effect transistors may be used so that the second differential pair may be composed of standard field effect transistors that typically have better matching characteristics than high voltage field effect transistors. The use of the high voltage field effect transistors in conjunction with the standard low voltage field effect transistors results in lower operational amplifier offset. Accordingly, the principles of the present invention provide for a high voltage, low-offset rail-to-rail common mode input range operational amplifier that is compatible with standard digital CMOS processes.

The operational amplifier may also include an output stage as well as a coupling stage for coupling the input stage and the output stage. In the output stage, two standard low voltage field effect transistors serve as a dual current source (or sink). A high voltage field effect transistor is coupled between the output terminal and each of the low voltage current source (or sink) field effect transistors. This configuration may be present between the output terminal and the high supply voltage as well as between the output terminal and the low supply voltage. This configuration in the output stage further reduces the offset of the operational amplifier.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate a high-voltage operational amplifier that has low-offset and wide common-mode input range and that may be integrated in a single-well CMOS process, thereby being compatible with standard digital CMOS processes.

One of the limitations of high voltage devices in a standard digital CMOS process is that the maximum gate-bulk voltage is much less than the maximum drain-bulk voltage. This means that if high voltage devices are used as the differential input devices, the input range will be constrained by the maximum gate-bulk voltage.

Figure 5:
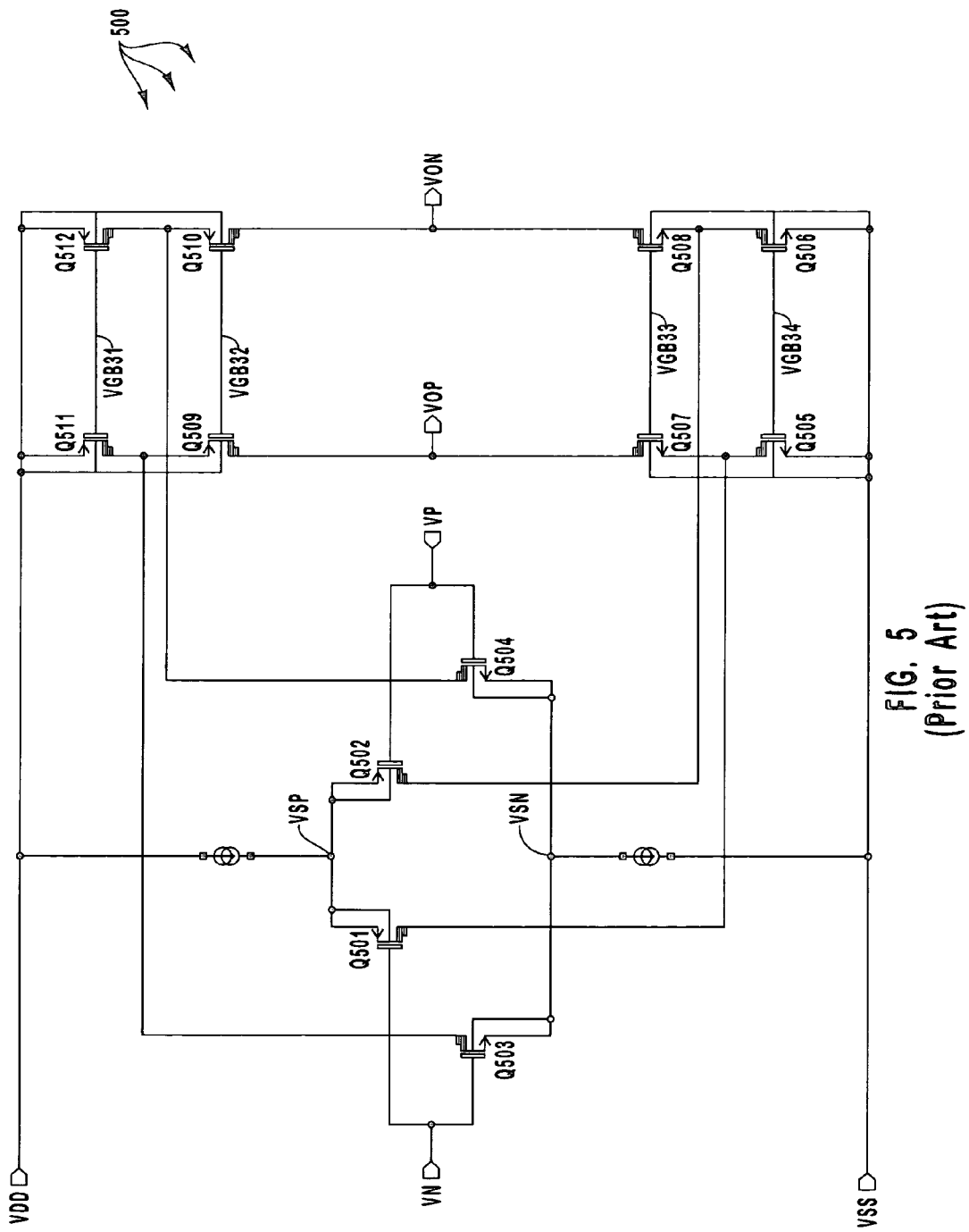
FIG. 5 is a circuit diagram of a rail-to-rail common mode input range operational amplifier in accordance with the prior art.

High voltage amplifiers often use feedback to assure that each device is within its safe operating area. Referencing FIG. 5, it is apparent that that as the voltage changes on the gates of devices Q501, Q502, Q503 and Q504, voltage nodes VSP and VSN change with the gate voltage, keeping the gate-source voltage and gate-bulk voltage within their breakdown voltages.

However, in the case of a single well (i.e., n-well) CMOS process where the substrate is fixed at VSS, the gate-bulk breakdowns of devices Q503 and Q504 would be violated when the input voltage was greater than the gate-bulk breakdown. The opposite would occur if the design were in a p-well CMOS process, where the substrate was tied to VDD. In this case, the gate-bulk breakdown voltage of the PMOS input devices would be violated.

Figure 1:
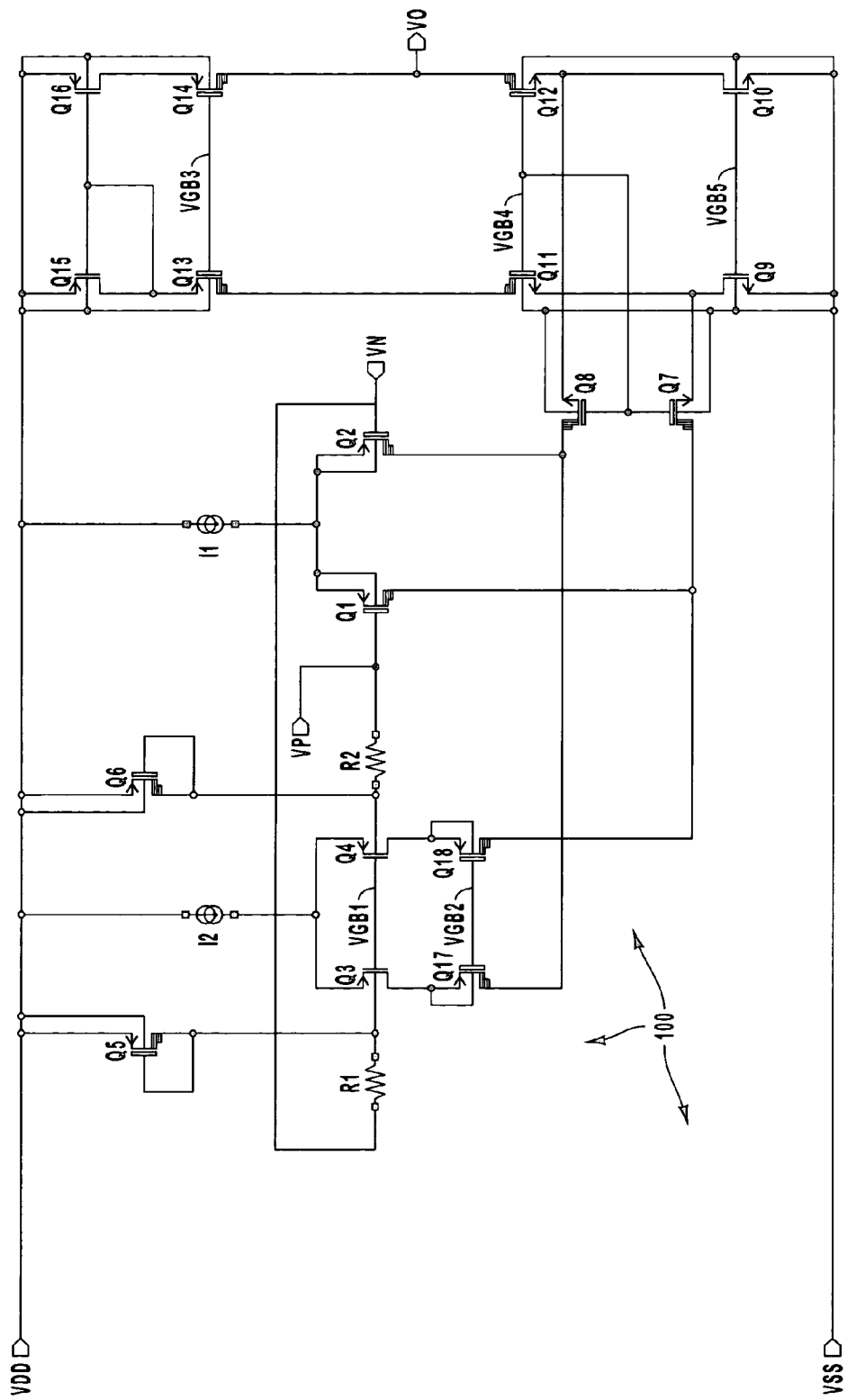
FIG. 1 is a circuit diagram of a rail-to-rail common mode input range operational amplifier in accordance with a first embodiment of the present invention in which the operational amplifier is constructed using a single n-well process, and in which the input stage uses a bulk driven differential pair.
Figure 2:
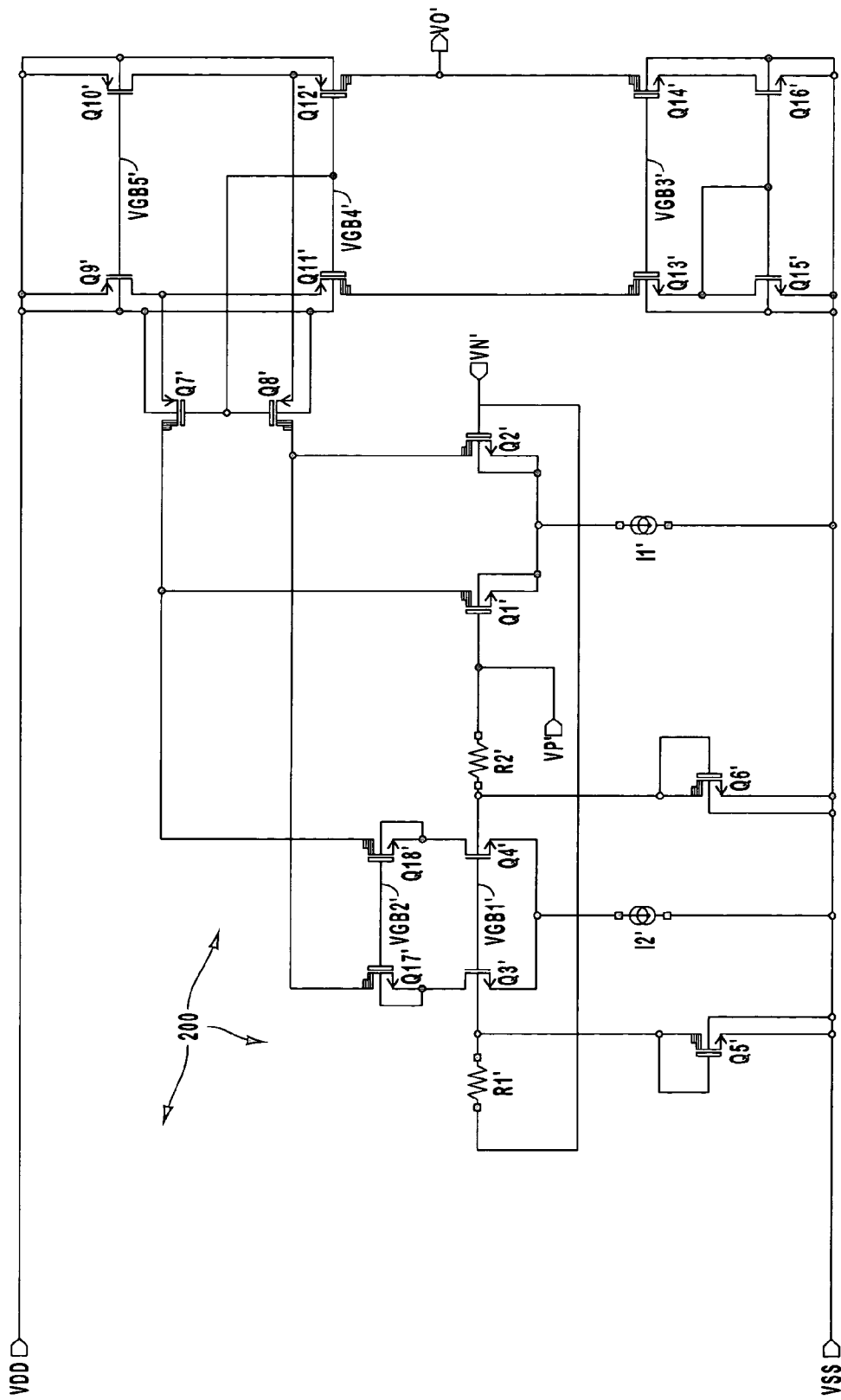
FIG. 2 is a circuit diagram of a rail-to-rail common mode input range operational amplifier in accordance with the first embodiment of the present invention in which the operational amplifier is constructed using a single p-well process, and in which the input stage uses a bulk driven differential pair.

In a first embodiment of the present invention described with respect to FIGS. 1 and 2, bulk-driven PMOS devices Q3 and Q4 (or NMOS devices Q3' and Q4') are used to achieve a high voltage rail-to-rail input range in a single n-well (or p-well) process. In FIG. 1, devices Q503 and Q504 are replaced with bulk-driven PMOS devices to allow the operational amplifier to be constructed using a single n-well process. In FIG. 2, devices Q503 and Q504 are replaced with bulk-driven NMOS devices to allow the operational amplifier to be constructed using a single p-well process. The operation of a bulk-driven MOSFET is of depletion type, which when paired with the gate-driven devices of Q1 and Q2 of FIG. 1 (or Q1' and Q2' of FIG. 2) allows for a rail-to-rail common mode input range. A second embodiment of the present invention illustrated with respect to FIG. 3 uses gate-driven depletion mode field effect transistors q3 and q4 in place of Q503 and Q504 in the prior art when fabricated using a single n-well process. Similarly FIG. 4 uses gate-driven depletion mode field effect transistors q3' and q4' in place of Q503 and Q504 when fabricated using a single p-well process.

Another difficulty in designing with high voltage devices is the limitation of their poor matching characteristics. Typically these devices have large mismatch coefficients, which make it difficult to design an amplifier for low input offset voltage. In an amplifier design, the most critical areas for achieving low-offset are the input differential pairs and the current mirror load in the output stage. By using high voltage cascode protection devices in the amplifier, low voltage devices with significantly better matching characteristics can be used for the input devices as well as the current mirror load. These high voltage cascode transistors protect the low voltage transistors, which are placed in critical matching areas where they can help improve the overall input offset voltage.

FIG. 1 is a circuit diagram of a high-voltage rail-to-rail common mode input range operational amplifier in accordance with a first embodiment of the present invention in which a differential pair in the input stage is bulk-driven, and uses a single well process in the form of an n-well process.

Referring to the input stage, transistors Q1 and Q2 generate the input range from VSS to VDD-VTP. Transistors Q3 and Q4 are bulk-driven PMOS transistors. Transistors Q3 and Q4 act as depletion type FETS, which allows the operational amplifier to operate while the input range is from (VDD-VTP) to VDD. Transistors Q5 and Q6 are diode-connected transistors that (along with resistor R1 and R2) keep Q3 and Q4 in a safe operating area when the input voltage falls below VDD-VTP. This also prevents the source-bulk PN-junction from forward biasing.

The gate terminals of transistors Q3 and Q4 are biased with voltage VGB1, which allows transistors Q3 and Q4 to be biased on, and allows the bulk terminal of the transistors Q3 and Q4 to be the driving point for the input stage.

Transistors Q7, Q8, Q11 and Q12 are high voltage cascode NMOS transistors that protect transistors Q9 and Q10 from high voltages. This allows transistors Q9 and Q10 to be low voltage NMOS devices, which have superior matching characteristics.

Transistors Q13 and Q14 are high voltage cascode PMOS transistors. They protect transistors Q15 and Q16, and allow them to be low voltage PMOS transistors, once again with superior matching characteristics. Transistors Q15 and Q16 make up the current mirror load. Therefore, superior matching characteristics here significantly lowers the input offset of the operational amplifier.

Transistors Q17 and Q18 are protection devices for the bulk-driven input transistors Q3 and Q4, which may be low-voltage PMOS transistors due to this protection. This is another critical matching area which will lower the offset of the operational amplifier due to the input transistors Q3 and Q4 being low-voltage transistors. The gate terminals of transistors Q17 and Q18 are biased with voltage VGB2, which is sufficient to keep transistors Q17 and Q18 on.

The cascode protection structures also provide the benefit of increased gain in the amplifier, which helps minimize the effects of offset voltage.

Accordingly, the principles of the present invention enable an operational amplifier design that has rail-to-rail common-mode input range and low-offset, and that may be implemented in a standard digital CMOS process. Therefore, the operational amplifier may be integrated with digital circuitry on the same chip, thereby reducing the size and cost of the overall circuit, and improving reliability.

The structure of the operational amplifier of FIG. 1 will now be described for purposes of providing antecedent basis for the claims. The operational amplifier 100 includes an input stage, a coupling stage and an output stage. Specifically, the operational amplifier 100 includes a positive input terminal VP, a negative input terminal VN, an output terminal VO, eighteen field effect transistors Q1 through Q18, two current sources I1 and I2, a high voltage rail VDD, a low voltage rail VSS, and five bias voltage sources VGB1 through VGB5. A field effect transistor will also be referred to herein as simply a "transistor".

Some of the transistors Q1, Q2, Q5 through Q8, Q11 through Q14, Q17 and Q18 are high voltage transistors. In the illustrated case, the high voltage transistors are lateral DMOS transistors. Others of the transistors Q3, Q4, Q9, Q10, Q15 and Q16 are standard low voltage transistors. Naturally, each transistor Q1 through Q18 has a gate terminal, a source terminal, a drain terminal, and a bulk terminal. Transistors Q1 through Q6 and Q13 through Q18 are of the same polarity being p-type transistors. Transistors Q7 through Q12 are of the same polarity being n-type transistors.

Referring to the input stage, the first differential pair (represented by transistors Q1 and Q2) is coupled to the first current source I1 as a standard differential pair. The gate terminal of the transistor Q1 is coupled to the positive input terminal VP. The gate terminal of the transistor Q2 is coupled to the negative input terminal VN. The bulk terminals of each of the transistors Q1 and Q2 are coupled to their respective source terminals. The current from the current source I1 is split between the channel regions of transistors Q1 and Q2 as directed by the voltages at the input terminals VP and VN.

The second differential pair (represented by transistors Q3 and Q4) is coupled to the second current source I2 also as a standard differential pair. In particular, the current from the current source I2 is split between the channel regions of transistors Q3 and Q4. In this case, however, the bulk terminal of the transistor Q3 is coupled to the negative input terminal VN via resistor R1. Furthermore, the bulk terminal of the transistor Q4 is coupled to the positive input terminal VP via resistor R2.

The bulk terminal of transistor Q3 is coupled to the drain terminal of high-voltage transistor Q5. The transistor Q5 is diode-connected having its source terminal coupled to VDD. Similarly, the bulk terminal of transistor Q4 is coupled to the drain terminal of high-voltage transistor Q6. The transistor Q6 is likewise diode-connected having its source terminal coupled to VDD. The combination of the transistor Q5, the resistor R1 coupled as shown to the bulk terminal of transistor Q3 ensures that the source to well PN junction in transistor Q3 does not forward bias. Similarly, the combination of the transistor Q6, the resistor R2 coupled as shown to the bulk terminal of the transistor Q4 ensures that the source to well PN junction in transistor Q4 does not forward bias. The transistor Q17 has a source terminal coupled to the drain terminal of transistor Q3, and the transistor Q18 has a source terminal coupled to the drain terminal of transistor Q4.

Referring to the coupling stage, the transistor Q7 has a drain terminal that is coupled to the drain terminal of the transistor Q18, and to the drain terminal of transistor Q1. The transistor Q8 has a drain terminal that is coupled to the drain terminal of the transistor Q17, and to the drain terminal of transistor Q2. The gate terminals of the transistors Q7 and Q8 are coupled together. The bulk terminals of transistors Q7 and Q8 are coupled to VSS.

Referring to the output stage, transistor Q11 has a source terminal that is coupled to the source terminal of the field effect transistor Q7. Transistor Q12 has a source terminal that is coupled to the source terminal of the field effect transistor Q8. The gate terminals of transistors Q11 and Q12 are coupled to each other and to the gate terminals of transistors Q7 and Q8. The bulk terminals of transistors Q11 and Q12 are coupled to VSS.

Transistor Q9 has a drain terminal that is coupled to the source terminal of the transistor Q11. Transistor Q10 has a drain terminal that is coupled to the source terminal of the transistor Q12. The source terminals of transistors Q9 and Q10 are coupled to VSS. The gate terminals of transistors Q9 and Q10 are coupled together. The bulk terminals of transistors Q9 and Q10 are coupled to VSS.

Transistor Q13 has a drain terminal that is coupled to the drain terminal of the transistor Q11. Transistor Q14 has a drain terminal that is coupled to the drain terminal of the transistor Q12. The gate terminals of transistors Q13 and Q14 are coupled together. The bulk terminals of transistors Q13 and Q14 are coupled to VDD.

Transistor Q15 has a drain terminal that is coupled to the source terminal of the transistor Q13. Transistor Q16 has a drain terminal that is coupled to the source terminal of the transistor Q14. The source terminals of transistors Q15 and Q16 are coupled to voltage source VDD. The gate terminals of transistors Q15 and Q16 are coupled to each other and to the drain terminal of transistor Q15. The bulk terminals of transistors Q15 and Q16 are coupled to VDD.

The high voltage transistors Q11 through Q14 protect low voltage transistors Q9, Q10, Q15 and Q16 respectively. This serves to reduce the offset of operational amplifier 100 despite being a high voltage operational amplifier.

FIG. 2 illustrates an operational amplifier 200 that is similar to the operational amplifier 100 described above with respect to FIG. 1, except for several notable differences. Specifically, the operational amplifier 200 is constructed using a single p-well process, whereas operational amplifier 100 is constructed using a single n-well process. In addition, any n-type transistors in FIG. 1 are p-type transistors in FIG. 2, and vice versa. All nodes connected to VDD in FIG. 1 are connected to VSS in FIG. 2, and vice versa.

Figure 3:
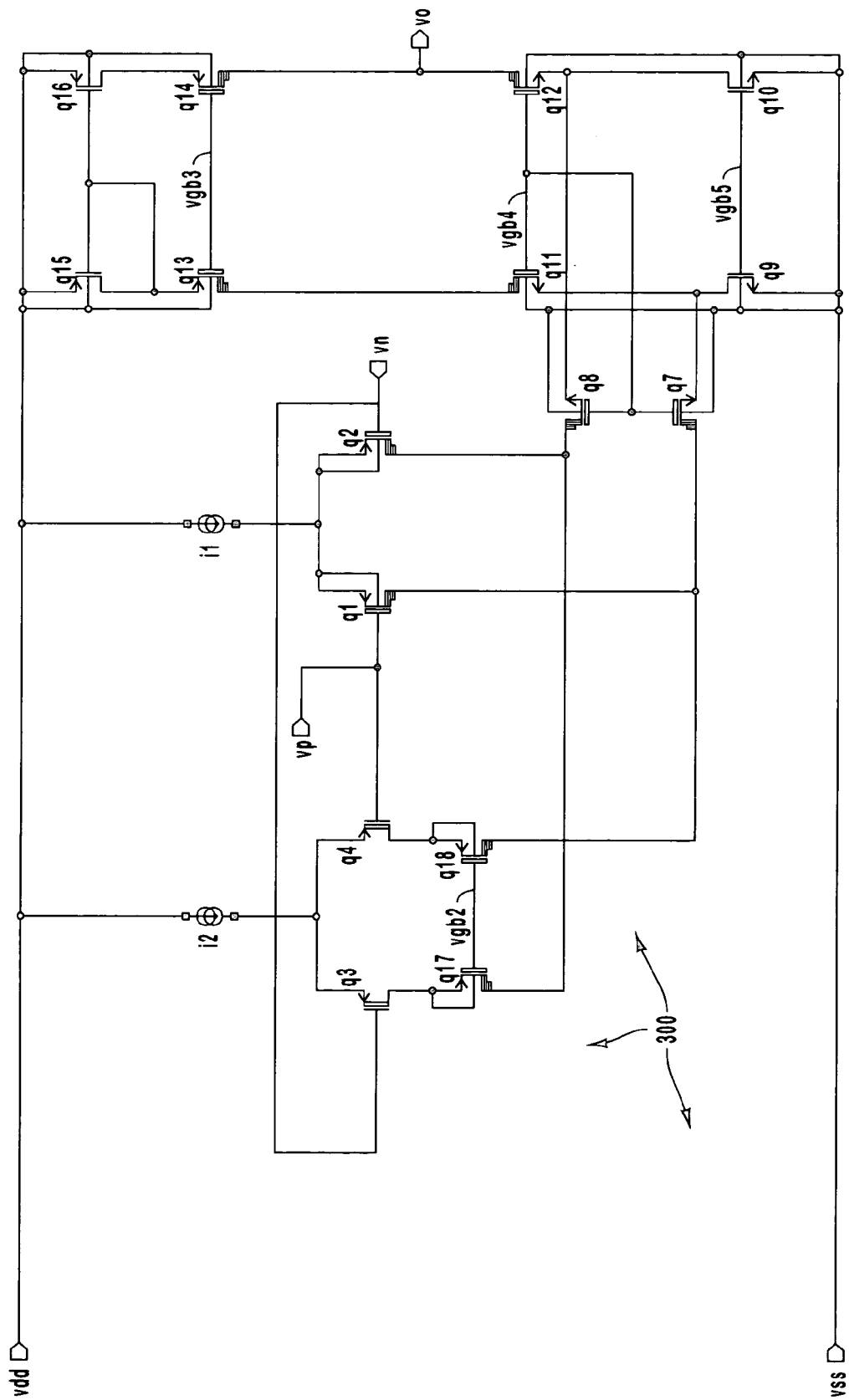
FIG. 3 is a circuit diagram of a rail-to-rail common mode input range operational amplifier in accordance with a second embodiment of the present invention in which the operational amplifier is constructed using a single n-well process, and in which the input stage uses a gate driven depletion type differential pair.

FIG. 3 illustrates an operational amplifier 300 that is similar to the operational amplifier 100 described above, except for the following differences. Specifically, the differential pair includes transistors q3 and q4 are gate-driven depletion type field effect transistors, instead of the bulk-driven enhancement type field effect transistors Q3 and Q4. The gate terminal of transistor q3 is coupled to the negative input terminal vn, whereas the gate terminal of transistor q4 is coupled to the positive input terminal vp. The resistors R1 and R2, and the transistors Q5 and Q6 are not included in FIG. 3. The bulk terminals of transistors q3 and q4 are coupled to their source terminals. The input impedance of the operational amplifier 300 of FIG. 3 is higher than the input impedance of the operational amplifier 100 of FIG. 1, although an additional depletion mode implant may be required.

Figure 4:
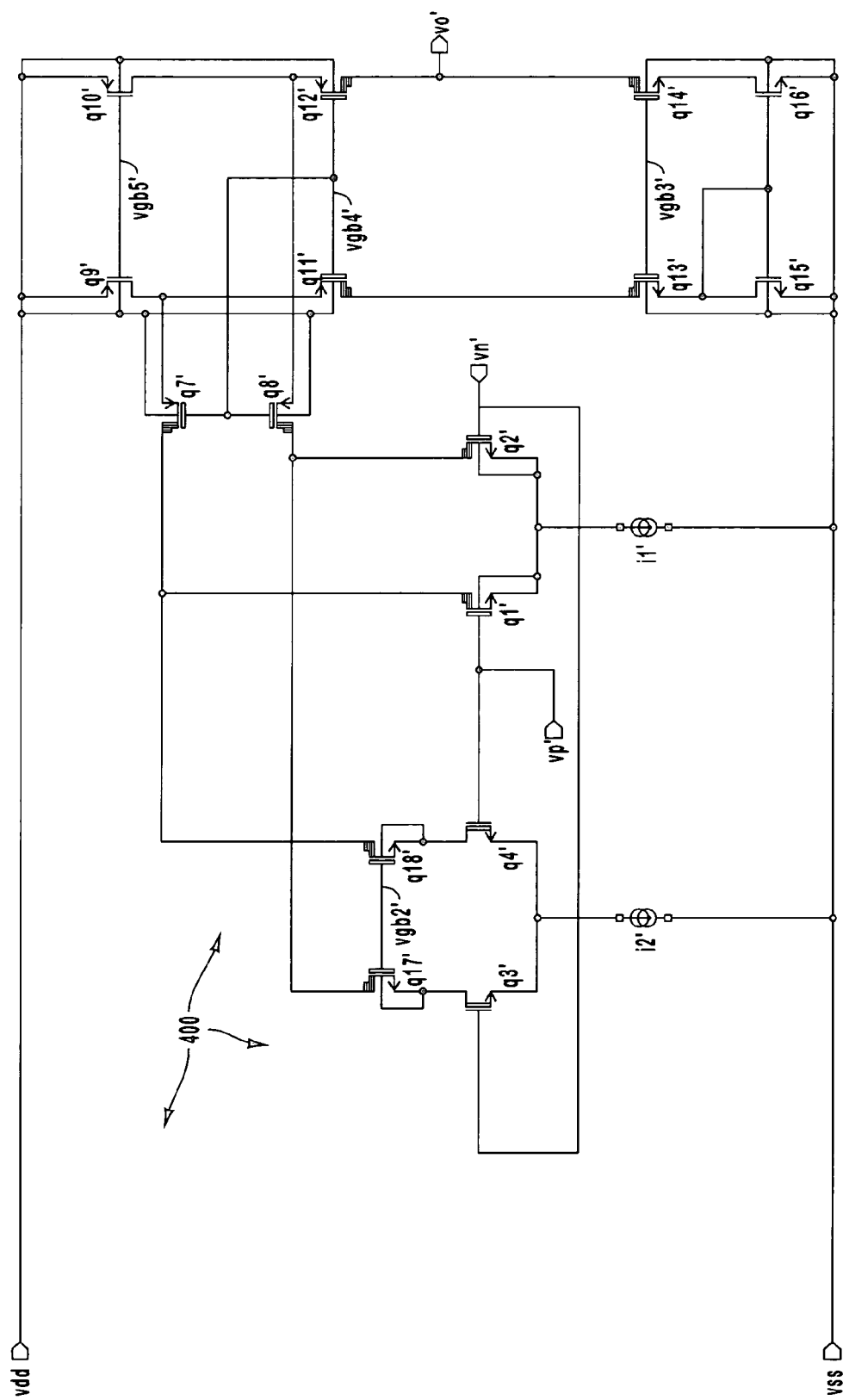
FIG. 4 is a circuit diagram of a rail-to-rail common mode input range operational amplifier in accordance with a second embodiment of the present invention in which the operational amplifier is constructed using a single p-well process, and in which the input stage uses a gate driven depletion type differential pair.

FIG. 4 illustrates an operational amplifier 400 that is similar to the operational amplifier 300 described above, except for the following differences. Specifically, the operational amplifier 400 is constructed using a single p-well process, whereas operational amplifier 300 is constructed using a single n-well process. In addition, any n-type transistors in FIG. 3 are p-type transistors in FIG. 4, and vice versa. All nodes connected to vdd in FIG. 3 are connected to vss in FIG. 4, and vice versa.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An operational amplifier comprising the following:
   a positive input terminal;
   a negative input terminal;
   a first current source;
   a second current source;
   a first differential pair coupled to the first current source, the first differential pair including a first field effect transistor and a second field effect transistor, each of the first and second field effect transistors having a source, drain, gate and bulk terminal, wherein the gate terminal of the first field effect transistor is coupled to the positive input teal and the gate terminal of the second field effect transistor is coupled to the negative input terminal; and
   a second differential pair coupled to the second current source, the second differential pair including a third field effect transistor and a fourth field effect transistor, each of the third and fourth field effect transistors having a source, drain, gate and bulk terminal, wherein the bulk terminal of the third field effect transistor is coupled to the negative input terminal and the bulk terminal of the fourth field effect transistor is coupled to the positive input terminal.

2. An operational amplifier in accordance with claim 1, wherein the first, second, third and fourth field effect transistors are each p-type field effect transistors.

3. An operational amplifier in accordance with claim 1, wherein the first, second, third and fourth field effect transistors are each n-type field effect transistors.

4. An operational amplifier in accordance with claim 1, wherein the bulk terminal of the third field effect transistor is coupled to the negative input terminal via a first resistor, and the bulk terminal of the fourth field effect transistor is coupled to the positive input terminal via a second resistor.

5. An operational amplifier in accordance with claim 4, further comprising the following:
   a fifth field effect transistor having a source, drain, gate and bulk terminal, the bulk terminal of the third field effect transistor being coupled to the drain terminal of the fifth field effect transistor, wherein the fifth field effect transistor has a source terminal coupled to a voltage source and is a high voltage field effect transistor coupled in diode configuration; and
   a sixth field effect transistor having a source, drain, gate and bulk terminal, the bulk terminal of the fourth field effect transistor being coupled to the drain terminal of the sixth field effect transistor, wherein the sixth field effect transistor has a source terminal coupled to the voltage source and is a high voltage field effect transistor coupled in diode configuration.

6. An operational amplifier in accordance with claim 5, wherein the voltage source is a first voltage source, and the gate terminals of the third and fourth field effect transistors are coupled to each other and to a second voltage source.

7. An operational amplifier in accordance with claim 6, further comprising the following:
   a seventh field effect transistor having a source, drain, gate and bulk terminal, wherein the source terminal of the seventh field effect transistor is coupled to the drain terminal of the third field effect transistor, the seventh field effect transistor being a high voltage field effect transistor; and
   an eighth field effect transistor having a source, drain, gate and bulk terminal, wherein the source terminal of the eighth field effect transistor is coupled to the drain terminal of the fourth field effect transistor, the eighth field effect transistor being a high voltage field effect transistor, the gate terminal of the eighth field effect transistor being coupled to the gate terminal of the seventh field effect transistor and to a third voltage source.

8. An operational amplifier in accordance with claim 7, farther comprising the following:
   a ninth field effect transistor having a source, drain, gate and bulk terminal and having a different polarity than the seventh and eighth field effect transistors, wherein the drain terminal of the ninth field effect transistor is coupled to the drain terminal of the eighth field effect transistor and to the drain terminal of the first field effect transistor, the ninth field effect transistor being a high voltage field effect transistor; and
   a tenth field effect transistor having a source, drain, gate and bulk terminal and having a different polarity than the seventh and eighth field effect transistors, wherein the drain terminal of the tenth field effect transistor is coupled to the drain terminal of the seventh field effect transistor and to the drain terminal of the second field effect transistor, the tenth field effect transistor being a high voltage field effect transistor, the gate terminal of the tenth field effect transistor being coupled to the gate terminal of the ninth field effect transistor and to a fourth voltage source.

9. An operational amplifier in accordance with claim 8, further comprising the following:
   an eleventh field effect transistor having a source, drain, gate and bulk terminal and having the same polarity as the ninth and tenth field effect transistors, wherein the source terminal of the eleventh field effect transistor is coupled to the source terminal of the ninth field effect transistor, the eleventh field effect transistor being a high voltage field effect transistor; and
   a twelfth field effect transistor having a source, drain, gate and bulk terminal and having the same polarity as the ninth and tenth field effect transistors, wherein the source terminal of the twelfth field effect transistor is coupled to the source terminal of the tenth field effect transistor, the twelfth field effect transistor being a high voltage field effect transistor, the gate terminal of the twelfth field effect transistor being coupled to the gate terminal of the eleventh field effect transistor to the gate terminals of the ninth and tenth field effect transistors, the drain terminal of the twelfth field effect transistor coupled to an output terminal of the operational amplifier.

10. An operational amplifier in accordance with claim 9, further comprising the following:
    an thirteenth field effect transistor having a source, drain, gate and bulk terminal and having the same polarity as the eleventh and twelfth field effect transistors, wherein the drain terminal of the thirteenth field effect transistor is coupled to the source terminal of the eleventh field effect transistor; and
    a fourteenth field effect transistor having a source, drain, gate and bulk terminal and having the same polarity as the eleventh and twelfth field effect transistors, wherein the drain terminal of the fourteenth field effect transistor is coupled to the source terminal of the twelfth field effect transistor, the gate terminal of the fourteenth field effect transistor being coupled to the gate terminal of the thirteenth field effect transistor and to a fifth voltage source, the source terminals of the thirteenth and fourteenth field effect transistors being coupled to a sixth voltage source.

11. An operational amplifier in accordance with claim 10, further comprising the following:
    a fifteenth field effect transistor having a source, drain, gate and bulk terminal and having a different polarity than the thirteen and fourteenth field effect transistors, wherein the drain terminal of the fifteenth field effect transistor is coupled to the drain terminal of the eleventh field effect transistor, wherein the fifteenth field effect transistor is a high voltage transistor; and
    a sixteenth effect transistor having a source, drain, gate and bulk terminal and having a different polarity as the thirteen and fourteenth field effect transistors, wherein the drain terminal of the sixteen field effect transistor is coupled to the drain terminal of the twelfth field effect transistor, wherein the sixteenth field effect transistor is a high voltage transistor, the gate terminal of the sixteenth field effect transistor being coupled to the gate terminal of the fifteenth field effect transistor and to a seventh voltage source.

12. An operational amplifier in accordance with claim 11, further comprising the following:
    a seventeenth field effect transistor having a source, drain, gate and bulk terminal and having the same polarity as the fifteenth and sixteenth field effect transistors, wherein the drain terminal of the seventeenth field effect transistor is coupled to the source terminal of the fifteenth field effect transistor; and
    an eighteenth field effect transistor having a source, drain, gate and bulk terminal and having the same polarity as the fifteenth and sixteenth field effect transistors, wherein the drain terminal of the eighteenth field effect transistor is coupled to the source terminal of the sixteenth field effect transistor, wherein gate terminal of the eighteenth field effect transistor is coupled to the gate terminal of the seventeenth field effect transistor and to the drain terminal of the seventeenth field effect transistor, the source terminals of the seventeenth and eighteenth field effect transistors being coupled to the first voltage source.

13. An operational amplifier in accordance with claim 1, wherein the gate terminals of the third and fourth field effect transistors are coupled to each other and to a first voltage source.

14. An operational amplifier in accordance with claim 13, further comprising the following:
    a fifth field effect transistor having a source, drain, gate and bulk terminal, wherein the source terminal of the fifth field effect transistor is coupled to the drain terminal of the third field effect transistor, the fifth field effect transistor being a high voltage field effect transistor; and
    a sixth field effect transistor having a source, drain, gate and bulk terminal, wherein the source terminal of the sixth field effect transistor is coupled to the drain terminal of the fourth field effect transistor, the sixth field effect transistor being a high voltage field effect transistor, the gate terminal of the sixth field effect transistor being coupled to the gate terminal of the fifth field effect transistor and to a second voltage source.

15. An operational amplifier in accordance with claim 14, further comprising the following:
    a seventh field effect transistor having a source, drain, gate and bulk terminal and having a different polarity than the fifth and sixth field effect transistors, wherein the drain terminal of the seventh field effect transistor is coupled to the drain terminal of the sixth field effect transistor and to the drain terminal of the first field effect transistor, the seventh field effect transistor being a high voltage field effect transistor; and an eighth field effect transistor having a source, drain, gate and bulk terminal and having a different polarity than the fifth and sixth field effect transistors, wherein the drain terminal of the eighth field effect transistor is coupled to the drain terminal of the fifth field effect transistor and to the drain terminal of the second field effect transistor, the eighth field effect transistor being a high voltage field effect transistor, the gate terminal of the eighth field effect transistor being coupled to the gate terminal of the seventh field effect transistor and to a third voltage source.

16. An operational amplifier in accordance with claim 15, further comprising the following:
a ninth field effect transistor having a source, drain, gate and bulk terminal and having the same polarity as the seventh and eighth field effect transistors, wherein the source terminal of the ninth field effect transistor is coupled to the source terminal of the seventh field effect transistor, the ninth field effect transistor being a high voltage field effect transistor; and
a tenth field effect transistor having a source, drain, gate and bulk terminal and having the same polarity as the seventh and eighth field effect transistors, wherein the source terminal of the tenth field effect transistor is coupled to the source terminal of the eighth field effect transistor, the tenth field effect transistor being a high voltage field effect transistor, the gate terminal of the tenth field effect transistor being coupled to the gate terminal of the ninth field effect transistor to the gate terminals of the seventh and eighth field effect transistors, the drain terminal of the tenth field effect transistor coupled to an output terminal of the operational amplifier.

17. An operational amplifier in accordance with claim 16, further comprising the following:
an eleventh field effect transistor having a source, drain, gate and bulk terminal and having the same polarity as the ninth and tenth field effect transistors, wherein the drain terminal of the eleventh field effect transistor is coupled to the source terminal of the ninth field effect transistor; and
a twelfth field effect transistor having a source, drain, gate and bulk terminal and having the same polarity as the ninth and tenth field effect transistors, wherein the drain terminal of the twelfth field effect transistor is coupled to the source terminal of the tenth field effect transistor, the gate terminal of the twelfth field effect transistor being coupled to the gate terminal of the eleventh field effect transistor and to a fourth voltage source, the source terminals of the eleventh and twelfth field effect transistors being coupled to a fifth voltage source.

18. An operational amplifier in accordance with claim 17, further comprising the following:
a thirteenth field effect transistor having a source, drain, gate and bulk terminal and having a different polarity than the eleventh and twelfth field effect transistors, wherein the drain terminal of the thirteen field effect transistor is coupled to the drain terminal of the ninth field effect transistor, wherein the thirteenth field effect transistor is a high voltage transistor; and
a fourteenth field effect transistor having a source, drain, gate and bulk terminal and having a different polarity as the eleventh and twelfth field effect transistors, wherein the drain terminal of the fourteenth field effect transistor is coupled to the drain terminal of the tenth field effect transistor, wherein the fourteenth field effect transistor is a high voltage transistor, the gate terminal of the fourteenth field effect transistor being coupled to the gate terminal of the thirteenth field effect transistor and to of a sixth voltage source.

19. An operational amplifier in accordance with claim 18, further comprising the following:
a fifteenth field effect transistor having a source, drain, gate and bulk terminal and having the same polarity as the thirteenth and fourteenth field effect transistors, wherein the drain terminal of the fifteenth field effect transistor is coupled to the source terminal of the thirteenth field effect transistor; and
a sixteenth field effect transistor having a source, drain, gate and bulk terminal and having the same polarity as the thirteenth and fourteenth field effect transistors, wherein the drain terminal of the sixteenth field effect transistor is coupled to the source terminal of the fourteenth field effect transistor, wherein gate terminal of the sixteenth field effect transistor is coupled to the gate terminal of the fifteenth field effect transistor and to the drain terminal of the fifteenth field effect transistor, the source terminals of the fifteenth and sixteenth field effect transistors being coupled to a seventh voltage source.

20. An operational amplifier in accordance with claim 1, wherein the first, second, third and fourth field effect transistors are not high voltage transistors.

21. An operational amplifier comprising the following:
a positive input terminal;
a negative input terminal;
a first current source;
a second current source;
a first differential pair coupled to the first current source, the first differential pair including a first field effect transistor and a second field effect transistor, each of the first and second field effect transistors having a source, drain, gate and bulk terminal, wherein the gate terminal of the first field effect transistor is coupled to the positive input terminal and the gate terminal of the second field effect transistor is coupled to the negative input terminal;
a second differential pair coupled to the second current source, the second differential pair including a first depletion type field effect transistor and a second depletion type field effect transistor, each of the first and second depletion type effect transistors having a source, drain, gate and bulk terminal, wherein the gate terminal of the first depletion type field effect transistor is coupled to the negative input terminal and the gate terminal of the second depletion type field effect transistor is coupled to the positive input terminal;
a third field effect transistor having a source, drain, gate and bulk terminal, wherein the source terminal of the third field effect transistor is coupled to the drain terminal of the first depletion type field effect transistor, the third field effect transistor being a high voltage field effect transistor; and
a fourth field effect transistor having a source, drain, gate and bulk terminal, wherein the source terminal of the fourth field effect transistor is coupled to the drain terminal of the second depletion type field effect transistor, the fourth field effect transistor being a high voltage field effect transistor, the gate terminal of the fourth field effect transistor being coupled to the gate terminal of the third field effect transistor and to a voltage source.

22. An operational amplifier in accordance with claim 21, wherein the first and second field effect transistors and the first and second depletion type field effect transistors are each p-type field effect transistors.

23. An operational amplifier in accordance with claim 21, wherein the first and second field effect transistors and the first and second depletion type field effect transistors are each n-type field effect transistors.

24. An operational amplifier in accordance with claim 21, wherein the voltage source is a first voltage source, the operational amplifier further comprising the following:
   a fifth field effect transistor having a source, drain, gate and bulk terminal and having a different polarity than the third and fourth field effect transistors, wherein the drain terminal of the fifth field effect transistor is coupled to the drain terminal of the fourth field effect transistor and to the drain terminal of the first field effect transistor, the fifth field effect transistor being a high voltage field effect transistor; and
   a sixth field effect transistor having a source, drain, gate and bulk terminal and having a different polarity than the third and fourth field effect transistors, wherein the drain terminal of the sixth field effect transistor is coupled to the drain terminal of the third field effect transistor and to the drain terminal of the second field effect transistor, the sixth field effect transistor being a high voltage field effect transistor, the gate terminal of the sixth field effect transistor being coupled to the gate terminal of the fifth field effect transistor and to a second voltage source.

25. An operational amplifier in accordance with claim 24, further comprising the following:
   a seventh field effect transistor having a source, drain, gate and bulk terminal and having the same polarity as the fifth and sixth field effect transistors, wherein the source terminal of the seventh field effect transistor is coupled to the source terminal of the fifth field effect transistor, the seventh field effect transistor being a high voltage field effect transistor; and
   an eighth field effect transistor having a source, drain, gate and bulk terminal and having the same polarity as the fifth and sixth field effect transistors, wherein the source terminal of the eighth field effect transistor is coupled to the source terminal of the sixth field effect transistor, the eighth field effect transistor being a high voltage field effect transistor, the gate terminal of the eighth field effect transistor being coupled to the gate terminal of the seventh field effect transistor to the gate terminals of the fifth and sixth field effect transistors, the drain terminal of the eighth field effect transistor coupled to an output terminal of the operational amplifier.

26. An operational amplifier in accordance with claim 25, further comprising the following:
   a ninth field effect transistor having a source, drain, gate and bulk terminal and having the same polarity as the seventh and eighth field effect transistors, wherein the drain terminal of the ninth field effect transistor is coupled to the source terminal of the seventh field effect transistor; and
   a tenth field effect transistor having a source, drain, gate and bulk terminal and having the same polarity as the seventh and eighth field effect transistors, wherein the drain terminal of the tenth field effect transistor is coupled to the source terminal of the eighth field effect transistor, the gate terminal of the tenth field effect transistor being coupled to the gate terminal of the ninth field effect transistor and to a third voltage source, the source terminals of the ninth and tenth field effect transistors being coupled to a fourth voltage source.

27. An operational amplifier in accordance with claim 26, further comprising the following:
   an eleventh field effect transistor having a source, drain, gate and bulk terminal and having a different polarity than the ninth and tenth field effect transistors, wherein the drain terminal of the eleventh field effect transistor is coupled to the drain terminal of the seventh field effect transistor, wherein the eleventh field effect transistor is a high voltage transistor; and
   a twelfth field effect transistor having a source, drain, gate and bulk terminal and having a different polarity as the ninth and tenth field effect transistors, wherein the drain terminal of the twelfth field effect transistor is coupled to the drain terminal of the eighth field effect transistor, wherein the twelfth field effect transistor is a high voltage transistor, the gate terminal of the twelfth field effect transistor being coupled to the gate terminal of the eleventh field effect transistor and to a fifth voltage source.

28. An operational amplifier in accordance with claim 27, further comprising the following:
   a thirteenth field effect transistor having a source, drain, gate and bulk terminal and having the same polarity as the eleventh and twelfth field effect transistors, wherein the drain terminal of the thirteenth field effect transistor is coupled to the source terminal of the eleventh field effect transistor; and
   a fourteenth field effect transistor having a source, drain, gate and bulk terminal and having the same polarity as the eleventh and twelfth field effect transistors, wherein the drain terminal of the fourteenth field effect transistor is coupled to the source terminal of the twelfth field effect transistor, wherein gate terminal of the fourteenth field effect transistor is coupled to the gate terminal of the thirteenth field effect transistor and to the drain terminal of the thirteenth field effect transistor, the source terminals of the thirteenth and fourteenth field effect transistors being coupled to a sixth voltage source.

29. An output stage of an operational amplifier comprising the following:
   a first voltage source;
   an output terminal;
   a first field effect transistor having a source, drain, gate and bulk terminal, the source terminal being coupled to the first voltage source, the first field effect transistor not being a high voltage field effect transistor;
   a second field effect transistor having a source, drain, gate and bulk terminal, the source terminal of the second field effect transistor being coupled to the first voltage source, the gate terminal of the second field effect transistor being coupled to the gate terminal of the first field effect transistor and to the drain terminal of the first field effect transistor, the second field effect transistor not being a high voltage field effect transistor;
   a first high voltage field effect transistor having a source, drain, gate and bulk terminal, the source terminal of the first high voltage field effect transistor being coupled to the drain terminal of the first field effect transistor; and
   a second high voltage field effect transistor having a source, drain, gate and bulk terminal, the source terminal of the second high voltage field effect transistor being coupled to the drain terminal of the second field effect transistor, the drain terminal of the second high voltage field effect transistor being coupled to the output terminal, the gate terminal of the second high voltage field effect transistor being coupled to the gate terminal of the first high voltage field effect transistor and to a second voltage source.

30. An output stage in accordance with claim 29, wherein the first voltage source is a high supply voltage, the fire and second field effect transistors are p-type, and the first and second high voltage field effect transistors are p-type.

31. An output stage in accordance with claim 30, wherein the first voltage source is a low supply voltage, the first and second field effect transistor are n-type, and the first and second high voltage field effect transistors are n-type.

* * * * *

UNITED STATES PATENT AND TRADEMARK OFFICE
CERTIFICATE OF CORRECTION

| | |
|---|---|
| PATENT NO. | : 7,064,609 B1 |
| APPLICATION NO. | : 10/919757 |
| DATED | : June 20, 2006 |
| INVENTOR(S) | : Beck et al. |

It is certified that error appears in the above-identified patent and that said Letters Patent is hereby corrected as shown below:

Column 5
Line 17, change "resistor" to --resistors--

Column 8
Line 9, change "teal" to --terminal--

Column 9
Line 5, change "farther" to --further--

Column 15
Line 8, change "fire" to --first--

Column 16
Line 3, change "claim 30" to --claim 29--

Signed and Sealed this

Twelfth Day of December, 2006

JON W. DUDAS
*Director of the United States Patent and Trademark Office*